United States Patent [19]

Kisor et al.

[11] Patent Number: 4,979,039

[45] Date of Patent: Dec. 18, 1990

[54] METHOD AND APPARATUS FOR VECTOR QUANTIZATION BY HASHING

[75] Inventors: Gregory H. Kisor, West Jordan; James F. Parker, Provo, both of Utah; Edward J. King, Fremont, Calif.

[73] Assignee: Information Technologies Research Inc., Utah

[21] Appl. No.: 303,795

[22] Filed: Jan. 30, 1989

[51] Int. Cl.$^5$ ............................................. H04N 7/12
[52] U.S. Cl. .................................... 358/133; 341/106; 358/12
[58] Field of Search ................. 358/133, 135, 136, 11, 358/12, 432, 261–263; 341/106; 325/27, 122

[56] References Cited

U.S. PATENT DOCUMENTS

| | | |
|---|---|---|
| 4,107,669 | 8/1978 | Tewksbury . |
| 4,152,691 | 5/1979 | Ward . |
| 4,280,191 | 7/1981 | Rockett, Jr. . |
| 4,281,319 | 7/1981 | Roberts, Jr. . |
| 4,302,775 | 11/1981 | Widergren et al. . |
| 4,385,363 | 5/1983 | Widergren et al. . |
| 4,394,774 | 7/1983 | Widergren et al. . |
| 4,541,012 | 9/1985 | Tescher . |
| 4,560,977 | 12/1985 | Murakami et al. .................. 341/118 |
| 4,639,778 | 1/1987 | Yamaguchi et al. . |
| 4,652,905 | 3/1987 | Lippel . |
| 4,727,354 | 2/1988 | Lindsay ............................... 341/106 |
| 4,791,654 | 12/1988 | De Marca et al. ............. 358/133 X |
| 4,809,306 | 2/1989 | Goldstein et al. ................ 375/27 X |
| 4,811,265 | 3/1989 | Hashimoto et al. ............ 341/106 X |
| 4,837,632 | 6/1989 | Kubo et al. ...................... 358/133 X |

OTHER PUBLICATIONS

Arnstein, D. S., "Quantization Error in Predictive Coders", *IEEE Transactions on Communications*, vol. COM-23, No. 4, Apr. 1975, pp. 423–429.
Gersho, A., "Asymptotically Optimal Block Quantization", *IEEE Transactions on Information Theory*, vol. IT-25, No. 4, Jul. 1979, pp. 373–380.
Linde, et al., Y., "An Algorithm for Vector Quantizer Design", *IEEE Transactions on Communications*, vol. COM-28, No. 1, Jan. 1980, pp. 84–95.
Gray, et al., R. M., "Distortion Measures for Speech Processing", *IEEE Transactions on Acoustics, Speech, and Signal Processing*, No. 4, Aug. 1980, vol. ASSP-28, pp. 367–376.
Gray, et al., R. M., "Vector Quantizers and Predictive Quantizers for Gauss-Markov Sources", *IEEE Transactions on Communications*, vol. COM-30, No. 2, Feb. 1982, pp. 381–389.
Gersho, A., "On the Structure of Vector Quantizers", *IEEE Transactions on Information Theory*, vol. IT-28, No. 2, Mar. 1982, pp. 157–166.
Gray, et al., R. M. "Multiple Local Optima in Vector Quantizers", *IEEE Transactions on Information Theory*, vol. IT-28, No. 2, Mar. 1982, pp. 256, 261.
Abut, et al., H., "Vector Quantization of Speech and Speech-Like Waveforms", *IEEE Transactions on Acoustics, Speech, and Signal Processing*, vol. ASSP-30, No. 3, Jun. 1982, pp. 423–435.

*Primary Examiner*—Victor R. Kostak

[57] ABSTRACT

A method of and apparatus for vector quantization operates on binary signal vectors. Each signal vector contains a plurality of sample elements of a signal to be compressed. Each of the signal vectors is hashed to generate a value identifying one of at least three different subsets of code words collectively constituting a set of binary code words. Each code word is equal in length to the length of each of the signal vectors and has associated with it a unique binary code of a lesser length. The vector quantizer performs a distortion comparison search through the code words of the selected subset to identify the one code word and its uniquely associated code which has the least distortion of all of the code words of the one subset with respect to the hashed signal vector. That one code is outputted to represent the hashed signal vector. The subsets may be mutually exclusive and include a plurality of code words.

41 Claims, 5 Drawing Sheets

METHOD AND APPARATUS FOR VECTOR QUANTIZATION BY HASHING

FIELD OF THE INVENTION

The invention relates to signal processing and, in particular, to methods and apparatus for data compression by vector quantization.

BACKGROUND

Data compression is the process of representing a large amount of data with a smaller amount of data. Data compression is typically used to map a large bandwith signal into a smaller bandwith channel for transmission or storage.

One method of data compression that has gained recent interest is vector quantization. Vector quantization affords a higher compression ratio without sacrificing significant signal quality to the degree required by other data compression methods.

Vector quantization lends itself particularly well to sound or image signals that will be observed and interpreted by the human senses. Human senses require less accuracy than machine interpreted data. For example, the data needed to store and identically reproduce a color video image, displayed on a conventional television, can be compressed significantly without losing the essence of the main image.

To compress a signal by vector quantization, the signal must be in the form of a digital representation. An analog signal is typically digitized by using analog to digital converters. The digital data of the analog signal can then be grouped into blocks that will henceforth be referred to as signal vectors. Vectors can be any N by M group of digitized data elements of the original signal, with N and M being any integer value.

Vector quantization requires a "code book" or its equivalent. The code book contains "code words". Code words are representative vectors which are used to approximate the signal vectors being generated from the original signal.

Typically, the representative vectors or code words are generally created using a probability density function. Several sample signals that can be considered typical of the types of signals that will be compressed, are converted into vectors in the same manner as the signal(s) to be compressed. The probability density function is used to identify those vectors which are most likely to occur and which can be used to best represent all of the signal vectors generated from the signal(s) to be compressed.

Each code word in the code book has a unique associated code. The code has fewer binary elements than the code word itself and fewer binary elements than any signal vector represented by the code word. The smaller in size the code is with respect to the size of the code word, the greater the compression.

Typically the code words will be stored in an electronic memory. The code uniquely associated with each code word can be that code word's unique address in the memory.

After creating a code book of code words, each of the signal vectors generated from a signal to be compressed is compared with the code words to find one code word that best represents the signal vector. Best representation in vector quantization generally means that code word having the least distortion with respect to the signal vector of any of the code words in the code book.

Previously, comparison for vector quantization has been done by a sequential search through the code book. The sequential search compares each signal vector to all code words in the code book. Theoretically, comparison for vector quantization can also be performed by a tree structured search. The tree structured search compares each signal vector to code words in the code book in an order that depends on the result of each comparison. In the tree structured search, comparisons with code words continue to be made along a path down a previously defined branch in the code book if a lower distortion continues to be found.

If N represents the number of code words in the code book, then the number of searches required for each signal vector is N in the sequential case and $\log_2 N$ for the tree structured case.

While both the sequential and tree structured searches have their advantages, they also have drawbacks. The sequential search requires that every code word be examined in every case. The tree structured search requires an initial ordering of the code words that assures that the proper code word will always be found. The difficulty of ordering a tree structured search effectively eliminates its applicability to all but the simplest forms of vector quantization involving a very limited number of code words.

Once the least distorted code word is found, the signal vector is then replaced with the code associated with that code word. For example, if the code book contains 256 different code words, then each code word, and thus each signal vector, can be represented by a code consisting of a single, eight-bit binary number or byte.

This method of substituting an abbreviated code identifying a larger, representative vector, is the quantization of the signal vector. If the original signal vector contains sixteen bytes, its representation by a one-byte code provides a sixteen-to-one compression ratio.

A representation of the original signal can be recreated by reversing the procedure using the codes to identify one or a series of code words which in turn represent the original signal vectors. The code word(s) may then be used to generate a decompressed signal approximating the original signal.

Further details regarding the theory and practice of data processing for and compression by sequential and tree structured searching vector quantizers can be found in U.S. Pat. No. 4,560,977 incorporated by reference herein in its entirety.

SUMMARY OF THE INVENTION

In one aspect, the invention is a vector quantizer for data compression of a signal represented as a plurality of binary signal vectors, each signal vector being of a predetermined length and including a plurality of individual sample elements of the signal to be compressed. The vector quantizer of the present invention comprises: hashing means for hashing each signal vector to generate a value identifying one of at least three different predetermined subsets of predetermined code words, each code word having a length equal to the predetermined length of the signal vectors and each code word having a unique associated binary code, each of the codes having a length less than the predetermined length of the signal vectors and code words; and output means for outputting from the vector quantizer a code associated with one code word of the one subset to represent the hashed signal vector, the one code word having the least distortion with respect to the hashed signal vector of all of the code words of the one subset.

Another aspect of the invention is a method of compressing data of a signal by vector quantization, the signal being represented by a plurality of signal vectors, each signal vector having a predetermined length and including a plurality of individual sample elements of the signal to be compressed. The method comprises the steps of: hashing each signal vector to generate a value identifying one of at least three different predetermined subsets of predetermined code words, each code word having a length equal to the predetermined length of the signal vectors and each code word having a unique associated binary code, each of the codes having a length less than the predetermined length of the signal vectors and code words; and outputting a code associated with one code word of the one subset to represent the hashed signal vector, the one code word having the least distortion with respect to the signal vector of all of the code words of the one subset.

BRIEF DESCRIPTION OF THE DRAWINGS

The foregoing Summary, as well as the following Detailed Description of Preferred and Other Embodiments of the Invention, will be better understood when read in conjunction with the appended drawings. It is understood, however, that this invention is not limited to the precise arrangements illustrated. In the drawings.

DETAILED DESCRIPTION OF PREFERRED AND OTHER EMBODIMENTS OF THE INVENTION

Figure 1:
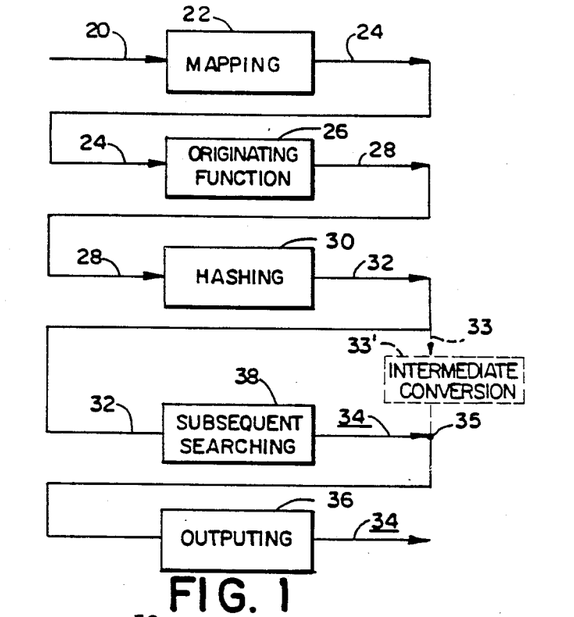
FIG. 1 depicts diagrammatically the major components for practicing and the steps of a method for vector quantization by hashing.

FIG. 1 depicts diagrammatically, in the broadest terms, vector quantization by hashing according to the present invention.

In order to compress the data of a signal by vector quantization, it is first necessary to provide the data of the signal to be compressed in a usable form. Initially, an analog input signal 20 to be compressed is sent through a mapping means 22 having a mapping function for mapping the input signal 20 into a Euclidean signal space, in particular a Gaussian signal space of dimension n, n being a number greater than or equal to 1. The resulting Gaussian space signal 24 next passes through an originating function means 26. The originating function means 26 converts the Gaussian space signal 24 into a plurality of signal vectors 28. Each of the signal vectors 28 includes, in binary form, a plurality of individual sample elements of the signal 20 to be compressed.

Next, each signal vector 28 is sent to a hashing means 30 having a hashing function for hashing the signal vector 28. Hashing is a term of art in computer processing. It represents the antithesis of an ordered search. Hashing, as practiced by this invention, involves the creation of a function which, when exercised on one or more predetermined portions of a signal vector 28, generates a value or "index" 32 identifying a corresponding record or an address where a corresponding record is found.

In particular, the hashing means 30 of the present invention operates on predetermined components of the signal vector 28 to generate a value or "index" 32 identifying one of at least three different predetermined subsets of predetermined code words. Different is used in the sense of non-identical. The subsets of code words collectively constitute a set, also referred to as a code book. It is conceivable that in some instances, some subsets will contain some identical code words as will later be explained. In some instances, some subsets, may, in fact, be identical. If identical subsets are provided there will still be at least three different subsets of code words when practicing this invention.

The code book may be a physical embodiment, such as a single digital memory or a collection of such memories dedicated to storing the code words, or a conceptual embodiment represented by stored code words scattered through a single memory device with other data.

If the hashing function embodied by hashing means 30 generates a unique value or index for each code word of the code book, it is known as a "perfect" hashing function. Each code word constitutes a separate subset of the code book. In such an instance, the value or index 32 generated by hashing each input vector 28 could be used as the code to represent and compress the hashed input vector 28.

If the hashing function is not perfect, it may generate the same value or index for two or more different code words. This is known as a collision.

Perfect hashing functions are extremely difficult to find, and if found, are usually impractical to implement from a computational standpoint. Often, a combination of hashing to one of several subsets of code words, at least some of the subsets having several code words, and then a limited search through the subset is more practical. Even so, as opposed to the sequential and tree structured searching methods previously discussed, the time savings in data compressing by hashing is dramatic.

A non-perfect hashing function generating collisions can be advantageously used to identify subsets of plural code words in the code book through mutual collision of the code words in each subset. Thus, the value or index 32 generated by a non-perfect hashing function can be used to identify a subset of the code words of the code book which are related in a predetermined, desired way, namely mutual collision, with one another and any hashed signal vector generating the same index. Where a non-perfect hashing function is used, a subsequent search through the identified subset of the code words is required. Such a search further requires that at least the code words of all of the subsets be stored for use in quantization.

The process paths for perfect and non-perfect hashing functions are further depicted diagrammatically in FIG. 1. As illustrated, where a perfect hashing function is used in the hashing means 30, the subsequent searching step and means 38 may be bypassed and the value or index 32 generated by the hashing means 30 sent directly, as indicated by the broken arrow 33, to a junction 35 for passage to an output means 36. The output means 36 is provided for outputting from the vector quantizer as the result of the quantization process, one code 34 for each hashed signal vector 28. The one code 34 is uniquely associated with one code word of the one subset identified by the hashing index 32 having the least distortion with respect to the hashed signal vector of all of the code words of the one subset. In most though not necessarily all cases, the one code word will have the least distortion with respect to the hashed signal vector of all of the code words of all of the subsets, i.e. the code book.

Where a perfect hashing function is used, the one code 34 may be identical to the value or index 32. If necessary or desirable, an intermediate conversion means 33' such as a look-up table can be provided to convert the index 32 into the corresponding code 34, such as a particular code word memory address. The output means 36 may output the one code 34 by transmitting the one code 34, by holding the one code 34 for sampling, or by any other arrangement by which binary data may be conventionally transferred.

Where a non-perfect hashing function is used in the hashing means 30, the value or index 32 identified by hashing the signal vector 28 is outputted from the hashing means 30 to a subsequent searching means 38. Preferably, the subsequent search means 38 identifies and selects one of the code words of the one subset identified by the value or index 32 to represent the hashed signal vector 28 and cooperates with the output means 36 to output from the output means 36 the unique code 34 associated with that one code word. Again, the one code 34 may be the address of the one code word in the code book.

The address or other unique associated code 34 is a data block having a predetermined number of binary bits. The code 34 has fewer bits than do any of the signal vectors 28 and any of the code words themselves. The size, in bits, of the address or code 34 in comparison to the size, in bits, of the hashed signal vector 28, indicates the degree of compression of the signal vector by use of the code 34. The outputted one code 34 may thereafter be stored and/or retransmitted as the compressed representation of the original signal vector 28.

In practice, collisions and subset searching can be handled by means of an intermediate "hashing table". The hashing table includes each of the code words or, preferably, the memory addresses of each of the code words of the set constituting the code book, structured into subsets. Each of the subsets of code words or addresses is identified by one of the different values or indices 32 that may be generated by the hashing means 30 operating on any of the signal vectors 28. Preferably, each of the subsets of code words or addresses contains at least all of the code words or the addresses of all of the code words generating that index when the code words are themselves hashed by the hashing means 30.

Figure 2:
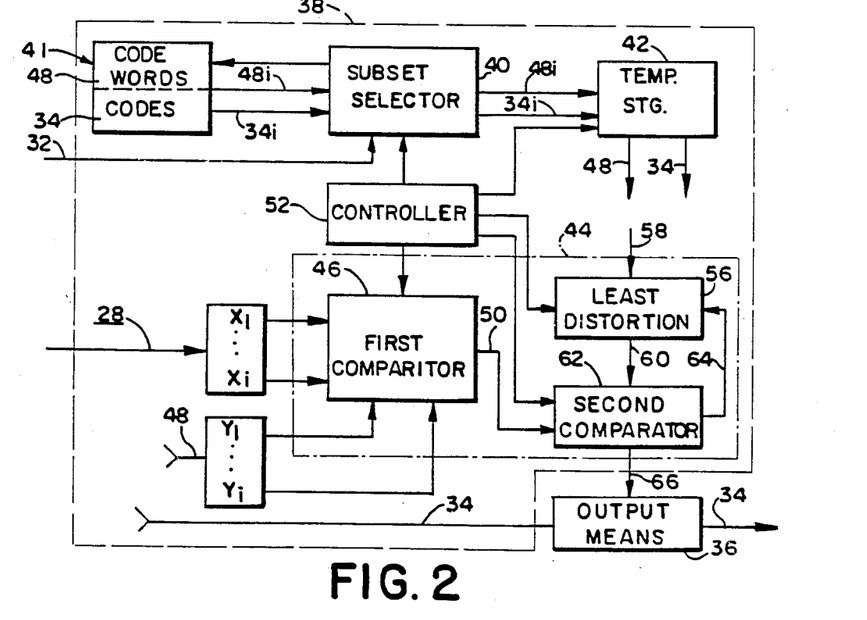
FIG. 2 depicts diagrammatically the major components for practicing and the steps of a method for searching through a subset of a plurality of code words to identify the one representative code word having the least distortion.

The major components of one embodiment of a subsequent search means 38 are depicted diagrammatically in FIG. 2. The subsequent search means 38 includes a subset selector means 40 which operates as the hashing table or its equivalent. The subset selector means 40 is preferably adapted for receiving the index or value 32 from the hashing means 30 (FIG. 1), identifying the selected code word subset 48$i$ represented by that value. Since the index 32 represents the identity of one of at least three different subsets, the index 32 must consist of two or more bits in a binary representation. The subset selector means is then configured to receive a plural bit index 32 from the hashing means 30. The subset selector means 40 transfers each of the code words 48 of the one identified subset 48$i$ of code words and a subset 34$i$ of the codes or addresses uniquely associated with each of the code words of the one subset 48$i$ from a code book 41 provided by a suitable memory device to a temporary storage means 42. The code book 41 may be a read only memory containing all the code words 48 of all of the subsets. It may further contain all of the codes 34 corresponding to those code words 48 arranged in subsets 34$i$ corresponding to the code word subsets 48$i$. The codes may be nothing more than the addresses of the locations of the code words 48 in the code book memory 41. The temporary storage means 42 may be an array of memory locations capable of storing the code words and codes or may be the conceptual designation of a work area of the code book 41. In either case temporary storage means 42 should provide access to the individual code words 48 contained in the subset 48$i$ and the corresponding unique code or address 34 of each code word 48.

The subsequent search means 38 preferably further includes a comparison means 44 including a first comparator circuit 46 and a second comparator circuit 62. The first comparator circuit 44 compares the hashed signal vector 28 sequentially with each of the code words 48 of the one selected subset 48$i$ for determining distortion between the hashed signal vector 28 and each code word 48 of the one subset 48$i$. The second comparator circuit 62 is responsive to the distortion outputs 50 of the first comparator circuit 46 for comparing the distortions 50 and identifying the one code word of the one subset 48$i$ of code words having the least distortion with respect to the hashed signal vector 28.

The first comparator circuit 46 preferably compares each data sample element $X_1 \ldots X_i$ of the hashed signal vector 28 with each corresponding data block $Y_1 \ldots Y_i$ of each code word 48 of the subset 48$i$ by differencing, squaring each of the differences, and then summing the squares to generate a distortion value 50 for each of the code words 48 of the subset 48$i$.

Each distortion value 50 is passed to the second comparator circuit 62. Preferably, for this embodiment, the code or address 34 associated with the code word 48 generating the particular distortion value 50 being passed to the second comparator circuit 62 is also passed to the output means 36 from the temporary storage means 42. The output means 36 may contain or simply be a device, such as a latch, for temporarily storing a code 34. Eventually, the output means 36 stores and outputs the one code 34 associated with the one code word having the least distortion with respect to the hashed signal vector 28 of all of the code words 48 of the one subset 48i. By proper arrangement of the code words and subsets, this one code word will further typically have the least distortion with respect to the hashed signal vector 28 of all of the code words 48 of the set constituting the code book.

The comparison means 44 may include a least distortion latch 56, which is initially loaded with a maximum permissible distortion value 58. The value 60 currently stored in the least distortion latch 56 is sent to the second, distortion comparator 62. The second comparator 62 has two outputs. The first output 64 is the lesser of the two distortion values compared. The second output is a load command 66 sent to the output means 36 if the latest distortion value 50 of the most recent code word/signal vector comparison was less than the distortion value 60 contained in the least distortion latch 56. When the load command 66 is sent to the output circuit 36, the output circuit 36 accepts or loads the code or address 34 of the code word 48 currently being compared and discards any previous address it may have contained.

The operations of the various circuits may be coordinated by a separate controller 52 or that function may be incorporated into one of the other circuits such as the subset selector circuit 40. Alternatively, the components of the subsequent search means 38 may be controlled by one of the other circuits depicted in FIG. 1 or by a master controller, not depicted. Although sequential processing is depicted, one or ordinary skill in this art will appreciate that the subsequent search means 38 can be configured for parallel processing or processing in any other organized manner.

After all the necessary comparisons are performed with the code words 48 of the one subset 48i, the output means 36 will contain the one code or address 34 of the one code word of the one subset 48i of code words having the least distortion with respect to the hashed signal vector 28 being quantized. This code or address 34 is all that is needed to reference that one code word with the least distortion. The output means 36 outputs the one code 34 associated with the one code word to represent the hashed signal vector 28. The code 34 is the only output from the subsequent search means and the vector quantizing process. In this way, the original analog signal 20, is converted into a plurality of signal vectors 28, and is eventually represented by a plurality of codes 34 each having a size, in numbers of binary bits, much smaller than the size of the original signal vectors. By using all of the addresses or codes 34 derived by the vector quantization process and device just described, a reconstituted signal can be created in a manner which will be subsequently described.

Figure 3:
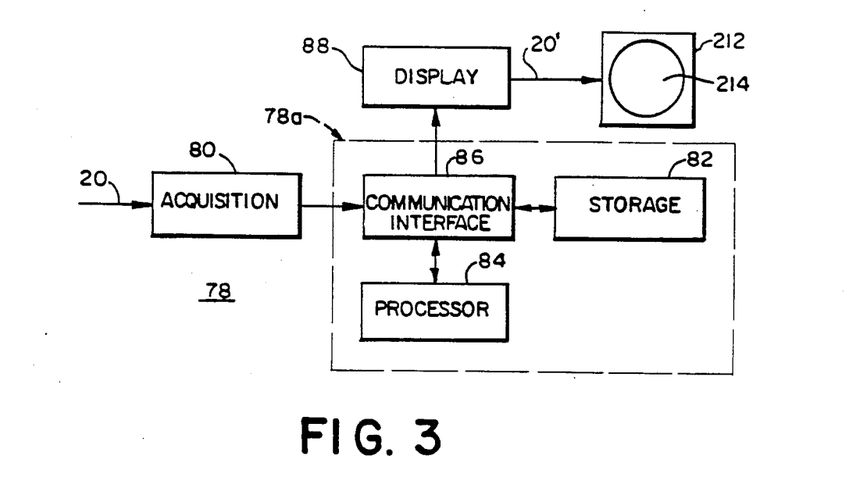
FIG. 3 depicts diagrammatically the major subsystems of a preferred vector quantizing video processing system according to the present invention.

FIG. 3 depicts diagrammatically, the major components of a preferred embodiment of the present invention, a vector quantizing video processing system or "VQ processing system" 78. The VQ processing system 78 is designed to acquire, transmit by any standard means and method, and display a color video image. Preferably, the VQ processing system 78 has five major subsystems: a video image acquisition subsystem 80, a video image storage subsystem 82, a video processor subsystem 84, a communications interface subsystem 86 and a video image display subsystem 88.

The video image acquisition subsystem 80 preferably is configured to act as a stand alone image digitizer for video image processing applications. The video image acquisition subsystem 80 receives and digitizes video image signals 20 which can then be transmitted, received and used directly, or stored and retrieved for later transmission and/or use.

Specifically, the preferred video image acquisition subsystem 80 receives an analog color video image signal 20 to be compressed, preferably in NTSC format, and translates that analog signal into encoded binary data that is usable by the circuits of the other subsystems 82–88. The encoded binary data can be displayed by the video image display subsystem 88 and/or stored in an unaltered state for future reference in the video image storage subsystem 82 or in another memory device.

Figure 4:
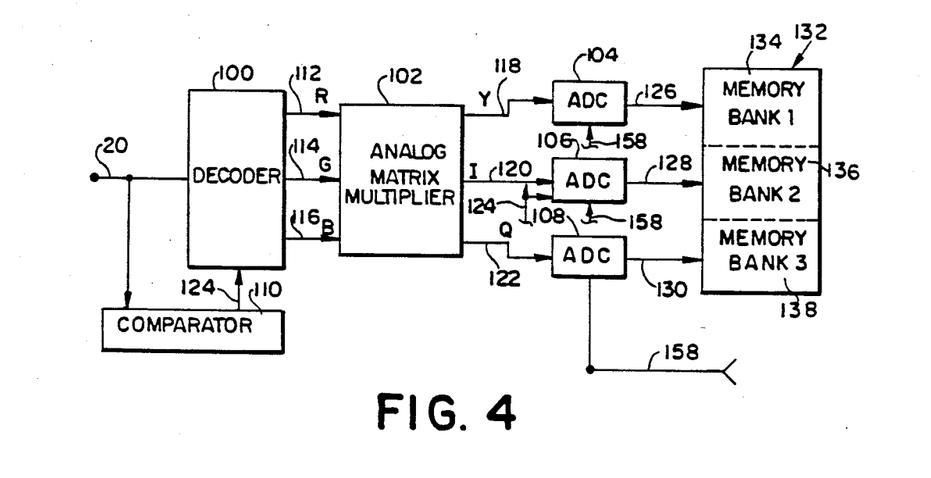
FIG. 4 depicts diagrammatically the major components of the video image acquisition subsystem of FIG. 3.

The major components of a preferred video image acquisition subsystem 80 are depicted diagrammatically in FIG. 4. These major components include a video signal decoder 100, preferably an NTSC format video signal decoder, an analog matrix multiplier 102, three, identical, parallel running, analog to digital converters ("ADC's") 104, 106 and 108, and a comparator circuit 110.

The comparator 110 strips synchronizing pulses from the incoming composite analog video signal 20 and generates a signal 124 which is used to time the operation of the decoder 100. Preferably, the video signal decoder 100 divides each single NTSC format video image frame of the analog signal 20 into 525 horizontal lines, each of which is divided into 520 equal segments. The video signal decoder 100 further separates Red, Green, and Blue (RGB) analog signal components 112, 114 and 116, respectively, from the composite analog signal 20. The analog matrix multiplier 102 converts the Red, Green and Blue analog signal components 112, 114, 116 into analog luminance (Y) and color difference (I and Q) signal components 118, 120 and 122, respectively. The Y, I and Q analog signal components 118, 120 and 122, respectively, are digitized into separate sets of pixels 126, 128 and 130, respectively, by the three, parallel analog to digital converters 104, 106 and 108, respectively. Preferably, the analog to digital converters 104 through 106 are operated at a frequency of at least 8 MHz by means of a clock signal 158. Each pixel is an eight-bit binary data element of one of the Y, I and Q signal components. Each pixel thus constitutes a sample element of the original composite, analog color signal 20. Pixel sets 126, 128 and 130 preferably are outputted in parallel from the three analog to digital converters 104, 106 and 108, respectively, to a memory device 132, which may include three separate, dedicated storage banks 134, 136 and 138 and may be part of the video image storage subsystem 82 or another device.

The video signal decoder 100 may be any of a variety of commercially available circuits such as RCA part number CA 3417. The ADC's 104–108 may also be any of a variety of commercially available circuits such as Phillips part number TDA 5703. The comparator 110 is any of a variety of circuits well known to those of ordinary skill in the color video signal processing art as is the analog matrix multiplier 102. The latter circuit may be obtained commercially from Japanese sources or constructed from high quality components such as RCA part number CA 3410 high speed op amps. The analog matrix multiplier 102 reverses the last stage of operation of the aforesaid RCA part number CA 3417 decoder circuit. That circuit first converts the analog signal 20 into Y, I and Q components and then converts the Y, I and Q components into the RGB components outputted by that circuit 100.

Figure 5:
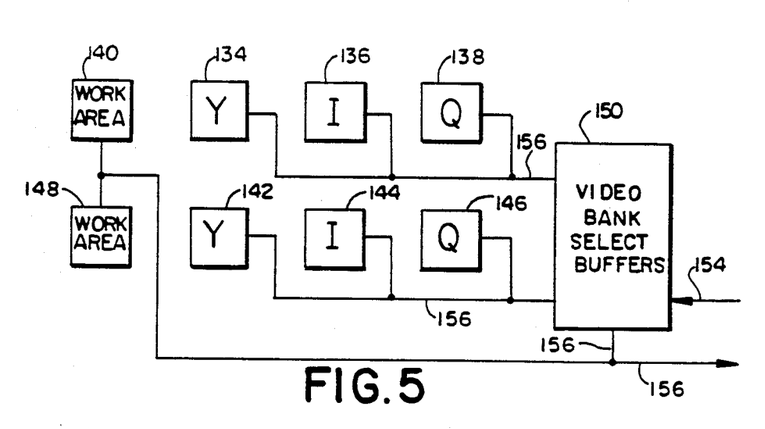
FIG. 5 depicts diagrammatically the major components of the video image storage subsystem of FIG. 3.

FIG. 5 depicts diagrammatically the major components of a preferred video image storage subsystem 82. Conveniently, the subsystem contains eight separate banks of memory 134, 136, 138, 140, 142, 144, 146 and 148. If used as the memory device 132, the separate pixels streams 126, 128 and 130 are preferably respectively stored in parallel in three of the banks 134, 136 and 138. A fourth bank 140 is provided as a work space for the video processor subsystem 84 while working with the video image stored in banks 134 through 138. The remaining banks 142 through 148 provide identical capability for a second video image.

Preferably, the video image storage subsystem 84 also includes an interface circuit 150 comprising a plurality of select buffers (not individually depicted) for transferring data to and from video image memory banks 134–140 and 142–146. Preferably, the circuit 150 is controlled by a microprocessor 152 (see FIG. 6), which constitutes part of the video processor subsystem 84, through an address bus 154. A data bus 156 carries the digitized data (pixels) of the component video signals Y, I and Q to and from the memory banks 134–138 or 142–146. The data bus 156 further provides direct access between the microprocessor 152 and the two data banks 140 and 148 reserved as work areas.

Figure 6:
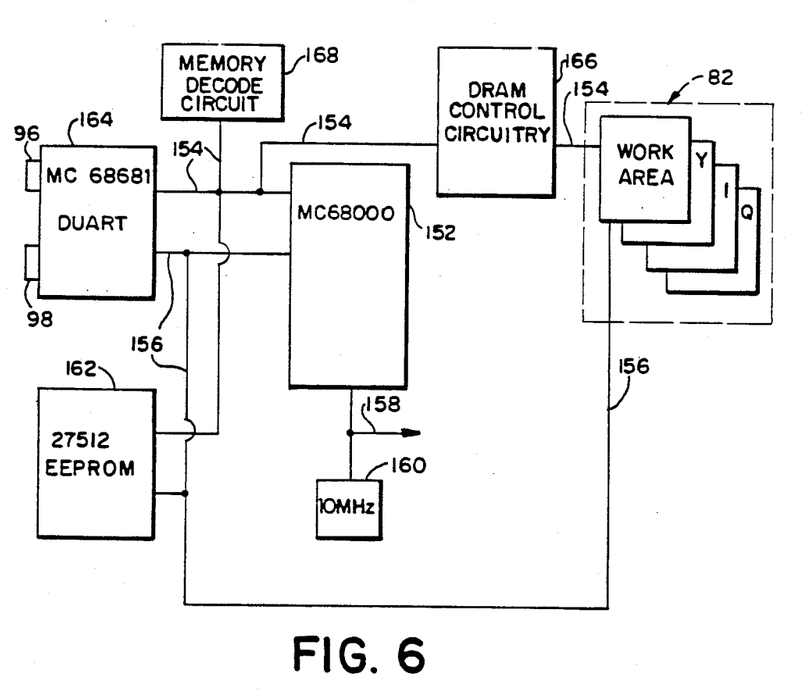
FIG. 6 depicts diagrammatically the major components of the vector processor subsystem and the communications interface subsystem of FIG. 3.

FIG. 6 depicts diagrammatically the major components of the vector processor and communications interface subsystems 84 and 86, respectively. These subsystems together with the video image storage subsystem 82 are the core elements of a coder/decoder which compresses and decompresses digital video image signals.

The video processor subsystem 84 takes the binary encoded video data generated by the video image acquisition subsystem 80 and stored in storage subsystem 82 or other storage area and compresses that data by vector quantization. Preferably, the video processor subsystem 84 is also configured to decompress the compressed data to generate a reconstituted video image signal 20' and display it with the video image display subsystem 88, a reconstituted video image of the original video image carried in the original video signal 20.

Preferably the communication interface subsystem is provided for communication outside the VQ processing system 78 and is configured to send and receive data that any general data base, or computer system can use, as well as to send and receive compressed (vector quantized) images. Also, the communication interface subsystem 86 provides operator access to and control of the video processor subsystem 84.

Referring to FIG. 6, preferably, the VQ processor subsystem 84 includes the microprocessor 152, preferably an MC 68000 chip which is dedicated to perform a specific program contained in a non-volatile memory 162. A clock 160 is associated with the microprocessor 152 and outputs the clock signal 158 (see also FIG. 4). Preferably, the non-volatile memory 162 is provided by a separate, programmable, read only memory chip such as a 27512 EEPROM. The non-volatile memory 162 stores the code words, their associated codes and any hashing table that may be provided, as well as the operating program of the microprocessor 152. The microprocessor 152 performs the various steps, including but not limited to look-ups, comparisons, identifications and arithmetic operations on the selected subsets and their code words and codes which are required to perform the previously described vector quantization process. Together the microprocessor 152 and non-volatile memory 162 provide the components and perform the operations of the hashing means 30, subsequent search means 38, code book storage 41 and output means 36 of FIGS. 1 and/or 2.

The video processor subsystem 84 further preferably includes a dynamic random access memory ("DRAM") control circuit 166, which is coupled with the video image storage subsystem 82, and a memory decode circuit 168, which is coupled with a "DUART" circuit 164, the dynamic random access memory control circuitry 166 and the non-volatile memory 162, to control the transfer of data to and from the memories 134 through 148 and 162 and the microprocessor 152. The address bus 154 couples the DUART circuit 164, the microprocessor 152, the non-volatile memory 162, the memory decode circuit 168 and the DRAM control circuit 166. The data bus 156 couples the microprocessor 152, non-volatile memory 162, the DUART circuit 164 and the video image storage subsystem 82. The memory decode circuit 168 supplies control signals through dedicated lines (not depicted) to the DUART circuit 164, the DRAM control circuit 166 and the nonvolatile memory 162 to enable those devices to coordinate data transfer on the data bus 156.

The communication interface subsystem 86 preferably includes the DUART ("Dual Universal Asynchronous Receiver and Transmitter") circuit 164, preferably in the form of an MC 68681 chip that provides two high-speed, serial ports 96 and 98 (depicted diagrammatically) preferably following RS-232/422 standards. One of the ports 96 and 98 provides a connection for a terminal device to send the necessary control signals to the subsystems so all functions can be controlled by the operator of the system 78. The other of the ports 96 and 98 could be used to connect the system 78 to another computer system. This other computer system could be a data base where images may be stored or retrieved.

The microprocessor 152 will execute instructions contained in the non-volatile memory 162 according to control codes received through the serial ports 96 or 98. The microprocessor 152 also controls the transmittal of control codes through the ports 96 and 98 according to the function(s) being performed by the video processing subsystem 84 in order to interact with outside systems.

Figure 7:
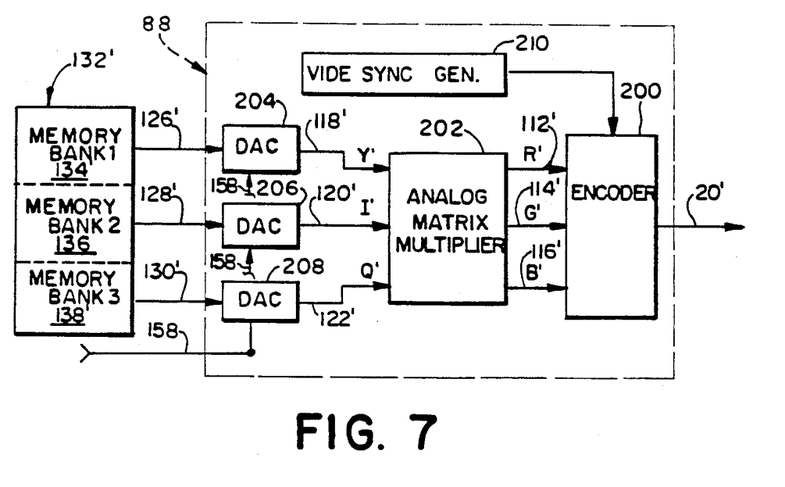
FIG. 7 depicts diagrammatically the major components of the video image display subsystem of FIG. 3.

The major components of a preferred video image display subsystem 88 are depicted diagrammatically in FIG. 7. These preferably include three parallel operating eight-bit digital to analog converters ("DAC") 204, 206 and 208, respectively, an analog matrix multiplier 202 coupled with the digital to analog converters 204–208, an NTSC format video signal encoder 200 and a video sync generator 210.

Preferably, the video image display subsystem 88 is configured to use computer coded image data in a non-compressed form to display a video image 214 on a display device 212 (see FIG. 3) capable of displaying an NTSC base band (demodulated) video signal. Preferably too, the video image display subsystem 88 is configured to receive this data from either of two sources: the coded digital data represented by pixel streams 126, 128 and 130 of FIG. 4, generated by the video acquisition subsystem 82, or similarly coded digital data generated from decompression of a compressed video image signal by the video processor subsystem 84.

The video image display subsystem 88 is substantially similar to the video image acquisition subsystem 82 but configured to operate in a reverse manner. Pixel streams 126', 128' and 130' containing the data of Y, I and Q component video signals are fed in parallel to the three eight-bit digital to analog converters 204, 206 and 208. The pixel streams 126', 128' and 130' may be fed from a suitable source such as memory banks 134', 136' and 138' of a mass memory device 132', which may be memory banks 134–138 or 142–146 of the video image storage system 82, directly from the video image acquisition subsystem 80 (see FIG. 4) or from another source (not shown). Again, the digital to analog converters 204–208 are preferably operated at the same clock frequency as the ADC's by clock signal 158 and output reconstituted, analog luminance (Y') and color difference (I' and Q') signals 118', 120' and 122', respectively, to the analog matrix multiplier 202. The analog matrix multiplier converts the reconstituted luminance (Y') and color difference (I' and Q') analog signal components into reconstituted Red, Green and Blue analog signal components 112', 114' and 116', respectively. The signals 112', 114' and 116' are passed to the video signal encoder 200 where, under the control of the video sync generator 210, they are converted into a composite, NTSC format, analog color image video signal 20'. The signal 20' may be fed to a television receiver 212 or similar device and displayed as a reconstituted video image 214 (see FIG. 3). An alternative configuration would be to use the Red, Green and Blue outputs from the analog matrix multiplier 202 to directly drive an RGB monitor.

The video synch generator 210, encoder 200 and DAC's 204–208 are any of a variety of commercially available circuits such as RCA part number CD 22402, Motorola part number MC 1377 and Phillips part number TDA 5702, respectively. Again, the analog matrix multiplier 202 is configured to reverse the operation of the initial stage of the encoder 200 which converts RGB signals to YIQ signals before combining them into the reconstituted composite analog color video signal 20'.

The preferred method of compression of the analog video image signal will now be explained in detail. Again, each video image frame in an NTSC format signal has 525 image lines, each of which can be divided into 520 equal segments. Each of the pixel sets 126, 128 and 130 generated from the three analog signal components Y, I and Q of a video image frame can be viewed as one of 525×520 elements in a two-dimensional video image matrix or plane. Forty-two of the 525 horizontal lines of each NTSC format signal video image plane are devoted to a black border to provide vertical flyback to restart the video display for a new image. Of the 520 equal segments into which each line can be divided, eight segments are dedicated to circuitry delays. Thus, of the 525×520 pixels generated for each signal Y, I and Q of each video image, only about 483×512 pixels of each of the Y, I and Q signals contain usable video image data. Also, most of the video image data is contained in the Y component signal.

Figure 8:
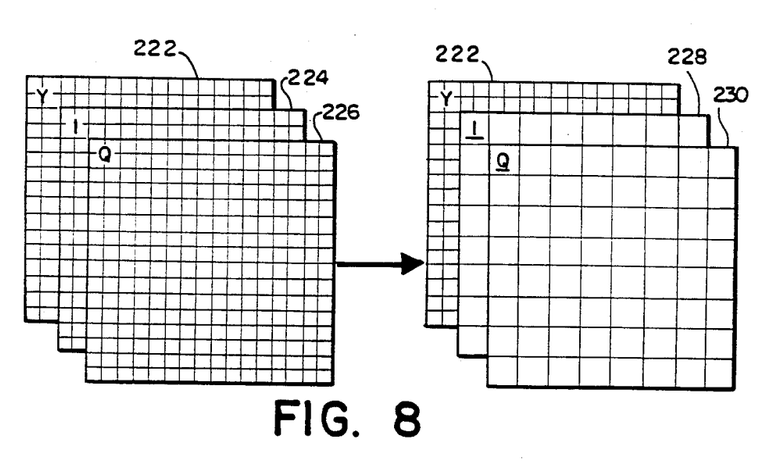
FIG. 8 depicts diagrammatically an initial compression of the data of a single video image by the apparatus.

FIG. 8 illustrates diagrammatically how the video processor subsystem 84 preferably is configured to take advantage of this scheme. Preferably, the video processor subsystem 84 considers only a submatrix of 512×512 pixels in each of the two-dimensional Y, I and Q component video image planes. These square submatrix planes are indicated at 222, 224 and 226, respectively in FIG. 8. Furthermore, the video processor subsystem 84 preferably initially compresses the image data to effectively reduce the data of the I and Q planes. Preferably, the video processor subsystem 84 averages every 2×2 block of adjoining pixels in each of the original 512×512 pixel I and Q planes 224 and 226 to provide effectively compressed, I and Q pixel planes 228 and 230, respectively, each of 256×256 averaged pixels. This averaging compresses the data in each of the I and Q planes 224 and 226 by a four to one ratio from the original planes 224 and 226.

The video processor subsystem 84 then groups the pixels of each plane 222, 228 and 230 into signal vectors 28. Preferably, square matrix portions (4×4) of mutually adjoining pixels and averaged pixels, of each of the two-dimensional arrays or planes 222, 228 and 230, each corresponding to an image frame portion of the video signal 20, are selected and grouped into individual signal vectors 28. The Y and compressed I and Q planes 222, 226 and 228 may be sequentially or simultaneously partitioned into signal vectors 28 of sixteen pixels each. Each of these signal vectors 28 is thereafter hashed by the video processor subsystem 84.

Preferably, the non-volatile memory 162 of the vector processor subsystem 84 is provided with a set of 256 code words constituting the code book. Each code word comprises a set of sixteen, eight-bit data blocks. Each data block of each of the code words is the counterpart of a pixel in each of the signal vectors 28. The code words are determined in any of a variety of ways, to be subsequently described, and are representative of the signal vectors 28 expected to be generated by the aforesaid process from the video image signal 20 being compressed. Preferably, the set of 256 code words is divided into 32 subsets, each of eight code words. Typically, the eight code words of each subset of the preferred embodiment VQ processing system 78 represent upper and lower horizontal dark edges, left and right vertical dark edges, dark diagonal edges in either direction and minimum and maximum uniform extremes (no edges) in each 4×4 array of pixels. Preferably, the thirty-two subsets 48i are mutually exclusive. None contains a code word also contained in any other subset. The video processor subsystem 84 hashes each signal vector 28 derived from the Y and reduced I and Q pixel planes 222, 228 and 230, respectively, to initially identify one of the 32 subsets of code words constituting the code book.

In the preferred exemplary embodiment, four diagonal pixels of the 4×4 array of pixels partitioned into each signal vector 28 are selected, combined by summing and the combination scaled by dividing the sum by thirty-two to generate a number greater than or equal to zero and less than thirty-two for identifying one of the thirty-two subsets of code words. The non-volatile memory 162 contains all 256 code words, each with a unique address. Each of the integer portions (zero to thirty-one) of the generated numbers constitutes the index or address 32 (see FIG. 1) that identifies an address in the non-volatile memory 162 (see FIG. 6) containing a subset of additional addresses in the non-volatile memory 162 corresponding to one of the subsets 48i of the set of 256 code words. Thus, the non-volatile memory 162 provides the hashing table as well as the code book of the system 78 and the video processor subsystem 84, in particular.

Preferably, each code word of the selected subset 48*i* is read by the microprocessor 152 from the non-volatile memory 162 and compared sequentially in the manner previously described, element by element (pixel by data block), with individual code words of the subset 48*i* to generate a distortion value 50 for each of the compared code words of the selected subset (see FIG. 2). Preferably, the difference between each pixel of the hashed signal vector 28 and each corresponding data block of the code word 48 is squared and the squared differences summed to generate the distortion value 50. The microprocessor 152 preferably compares the distortion value with the lowest previously identified distortion value 60 and retains the lesser value 64 (similar to FIG. 2). The address 34 in the non-volatile memory 162 of the code word 48 generating the lesser of the two compared distortion values is also saved by the microprocessor 152. When the comparisons of the hashed signal vector 28 with all of the code words of the selected subset 48*i* are completed, the address 34 that has been retained corresponds to the one code word having the least distortion with respect to the hashed signal vector 28. Since a single, eight-bit binary byte can be used to uniquely identify any of 256 different code words, each signal vector comprising sixteen, eight-bit pixels can be represented by a single, eight-bit code 34 identifying the one code word in the non-volatile memory 162 having the least distortion with respect to that hashed signal vector 28. Replacing each of the hashed signal vectors 28 with a single eight-bit code 34 results in a sixteen-to-one compression ratio of the signal vectors 28.

The address of the one code word having the least distortion with respect to the compared signal vector 28 is used as the code 34 for the hashed signal vector 28 and is placed by the microprocessor 152 in a compressed image file, which may be one of the two direct random access memory banks 140 or 148. The process is repeated by the microprocessor 152 for each signal vector 28 partitioned from each of the component pixel planes 222, 228 and 230 until all signal vectors of the Y and reduced I and Q planes 222, 228 and 230 have been quantized and a file of an entire compressed image is created containing only code word addresses or codes 34.

The building of a reconstituted image is accomplished by using microprocessor 152 to look up the code words 48 in the non-volatile memory 162 corresponding to the addresses or codes 34 in the compressed image file. The code words 48 are then substituted in place of the code word address and reconstituted 512×512 element Y', I' and Q' planes created. These planes contain only code words unblocked into "pixels". These planes can be stored in the memory banks 134–138 or 142–146, respectively. The "pixels" in these planes can then be fed under the control of the microprocessor 152 to the DAC's 204, 206 and 208 of the video image display subsystem 88 of FIG. 7. The subsystem 88 simultaneously converts the pixel streams 126', 128' and 130' to reconstituted Y', I' and Q' analog signals 118', 120' and 122', respectively, then reconstituted R', G' and B' analog signals 112', 114' and 116', respectively, which are then combined into an NTSC format analog composite color signal 20' (all in FIG. 7) and displayed on a conventional television receiver or monitor 212 (FIG. 3). Usually the total effect of compression and decompression of the signal 20 in this manner is the loss or blurring of sharp edges and fine background details while retaining the important, foreground main image(s).

The above describedsystem 78 provides a sixteen-to-one compression for the Y signal plane, and sixty-four-to-one ratios for the I and Q signal planes, due to initial averaging in the creation of the reduced I and Q pixel planes 228 and 230. The original image frame was comprised of three planes, each of 512×512 pixels, with eight bits per pixel, or 786,432, eight-bit pixels. This is compressed by the vector quantization process described into 18,432 eight-bit addresses or codes for an overall compression of 42.6-to-one. Huffman coding or similar compression techniques can then be used to practically double this to approximately eighty-to-one. The final compressed file could conceivably be smaller than 10,000 eight-bit bytes.

Next, the design and construction of a hashing vector processing system are explained. There are three major decisional steps involved. Each involves a choice on the part of the designer. The first choice is the overall approach taken to design the system. This involves selecting the order and manner in which the code words and hashing function are actually constructed. A second choice is the size of the code book. A third choice is the number of subsets into which the code words of the code book are divided. These latter two choices are made in the context of actually constructing the system once the first choice, the design approach, is made. Each of these major steps will now be considered.

The first major step is deciding how to design the system. This involves selecting the order and manner in which the code book and hashing function are created. In each case, signals representative of the signals to be compressed will be used to create code words. However, the manner in which this is done will impact computational speed and distortion.

Three possible design approaches can be followed for generating the code book and the hashing function: (1) generating the code words of the code book first and generating the hashing function from the code words; (2) generating the hashing function and then generating the code words of the code book using the hashing function; and (3) simultaneously generating the code book and the hashing function. These three approaches are illustrated diagrammatically in FIGS. 9 through 11. The selection of the code book size and the number of subsets are performed after selecting the manner in which the system is to be generated. Examples of each of the three possible approaches to designing the system now follow.

The first approach is to create the code book and then use the code book to define the hashing function. This is illustrated diagrammatically in FIG. 9. A multiplicity of sample vectors 248 of the chosen configuration are generated using signals typical of those to be compressed. For the compression of video image signals, the sample vectors 248 may be generated from a collection of video signals representing the same type of video images sought to be compressed. Code words 48 are generated by a code word generator 250. Preferably, the generator 250 incorporated a probability density function to identify the vector patterns that are most likely to occur when processing the sample vectors 248. A probability density function should be chosen for the generator 250 that will give satisfactory results considering the number of typical vectors 248 available for generating the code book and the hashing function and the proposed size of the code book. The probability density function could be as simple as counting the number of times each vector pattern occurs and selecting those that occur most often.

Figure 9:
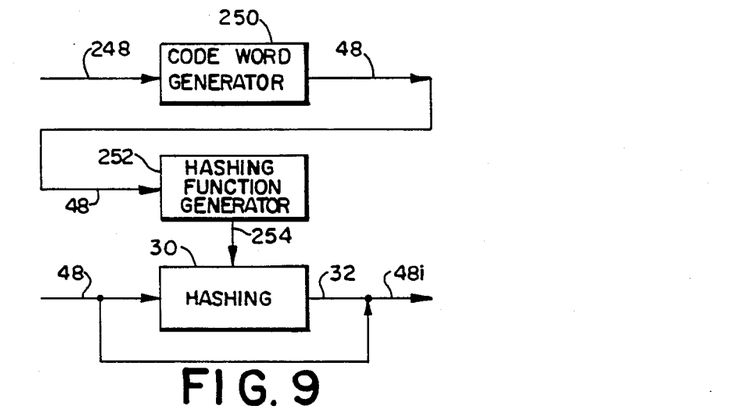
FIG. 9 depicts diagrammatically a first approach for generating the code words of the code book and the hashing function of the present invention.

A set of code words 48 are selected from these identified vector patterns to constitute the code book. The number of sample signal vectors 248 needed to create the code book is dependent on the statistical distribution chosen and the code book requirements. The number of code words 48 will affect the search time and amount of distortion with respect to the original signal being compressed. Search time increases while distortion decreases with increasing numbers of code words.

The next step is to generate a hashing function 254 using the code words 48 as is indicated diagrammatically in FIG. 9, by hashing function generator 252 In order to optimize for a speed of execution, the number of code word subsets or "codegroups" 48i should be maximized. If minimizing distortion is most important, then the number of codegroups 48i should be minimized. The exact number of codegroups 48i can be found using an iterative process directed to providing a desired level of resolution matched with an acceptable speed of execution. If the exact number of codegroups 48i is uncertain, then an initial choice or a number of codegroups 48i should be made. Once this choice is made, a hashing function 254 should be found that will hash each of the code words 48 into one of the codegroups 48i.

Initially, a hashing function 254 should be chosen that will take advantage of the physical structures of the vectors and will hash to the specified number of codegroups. The more complex the hashing function 254, the longer the computational time. The more accurately the hashing function 254 accounts for important features of the sample vectors 248 and the signal vectors 28 to be processed, the lower the distortion level. A hashing function 254 should be chosen that searches for those important features defining or distinguishing the codegroups or a mathematical manipulation of the components of the vectors 28 and 248 which will take into account these important features.

If the hashing function 254 has the possibility of generating a value or "index" 32 when hashing a vector 28 or 248 or a code word 48 that is not within the range of values or indices 32 defining codegroups 48i, it is unacceptable. The hashing function 254 is not permitted to be able to generate more than one possible index 32 for any given vector 248 or 28 or given code word 48. For example, if thirty-two codegroups 48i were selected, the hashing function 254 should generate a single integer index or code 32 in the range of one-to-thirty-two (or zero-to-thirty-one) from any code word 48 in the code book and any possible signal vector 28 or 248 hashed. The integers one to thirty-two or zero-to-thirty-one are the indices 32 of the hashing function 254. If the hashing function 254 will work properly with any possible code word 48, then the hashing function 254 will operate correctly on any given vector 248 and 28 as well. The hashing function 254 usually involves the averaging of selected individual data elements of the vector 248 or 28.

Once this hashing function 254 is found, it is passed to the hashing means 30 for use in hashing the code words 48 and subsequently the sample vectors 28. The code words 48 of the code book are hashed with the hashing means 30 to index the code words into the subsets of code words or codegroups 48i. The code words of the code groups 48i are passed to a storage means (not depicted) for subsequent use.

If there is at least one code word 48 in each codegroup 48i, then the hashing function 254 should be tried to ensure that the resolution of image and the speed of execution are acceptable. If there is not at least one code word 48 corresponding to each codegroup index 32 generated by the hashing function 254, then another choice must be made before the hashing means 30 can be used. The decision must be made whether to redefine the hashing function 254 (for example, average on different elements), or to create a codegroup for a vacant index. The latter may be as simple as assigning a one of the existing codegroups 48i for the vacant index. If an index 32 is reassigned in this way, it does not provide significant gain in execution time. This is due to the fact that the average number of codegroups 48i is decreased but the number of possible indices 32 stays the same. When reassigning the index, there may be some increase in signal distortion. A codegroup 48i should represent an important feature of the application signal. But this important feature is neglected when an index 32 is reassigned. It is likely that reassigning the index 32 will be easier to implement than finding a new hashing function 254. However, if many of the indices are reassigned, the computational time will likely increase, along with increases in signal distortion. Once the proper hashing function 254 is found, the system has the necessary components to do vector quantization according to the previous description.

This first approach optimizes the hashing function 254 to the code words 48 and not to the signal vectors 28. This usually increases the computational time needed to actually do quantization but decreases the signal distortion generated during the quantization process.

A second approach is to generate a hashing function directly from sample input vectors and then generating a code book from the other components. This is illustrated diagrammatically in FIG. 10. Again, the number of codegroups to be used is selected to provide a satisfactory execution time while producing acceptable levels of signal distortion.

Figure 10:
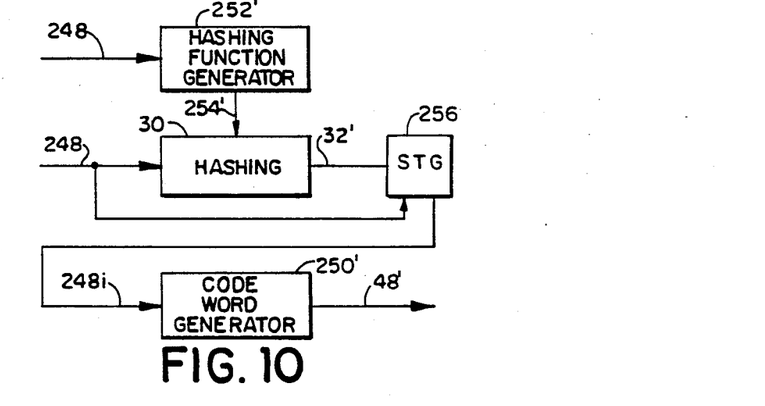
FIG. 10 depicts diagrammatically a second approach for generating the code words of the code book and the hashing function of the present invention.

A hashing function 254' is initially generated as is indicated diagrammatically by hashing function generator 252', from a multiplicity of sample signal vectors 248. The hashing function 254' that is generated is one that will assign only a single index 32' to any given vector 248 (or 28).

The multiplicity of sample vectors 248, are hashed using the hashing function 254' by the hashing means 30 and each hashed vector is assigned to a respective subset or codegroup 248i for example in a temporary storage 256 by means of the index 32' generated by the hashing means 30. If a sufficiently large number of sample vectors 248 are used, there will be a sizable number for each of the possible indices 32'. The next step is to use a code word generator 250', preferably with a probability density function, on the hashed sample vectors assigned to each subset or codegroup 248i to identify those sample vectors that are most likely to occur in each codegroup 248i. A specified number of these hashed sample vectors are chosen from each of the codegroups 248i to become the code words 48' of a code book. The code words 48' are stored organized into codegroups in storage for subsequent use. The choice of how many vectors are chosen from each codegroup 248i as the code words 48' is dependent upon the final results desired and whether one is optimizing for speed or minimum distortion. Again, the fewer number of code words 48', the faster the search time and the greater the signal distortion. The exact system can be found by iterating through the steps until acceptable speed and distortion levels are achieved.

This second approach has the advantage of being the easiest to implement but it does not allow as much flexibility in the final optimization steps. Also, a large number of sample vectors 248 are needed to ensure that the results are valid. The exact number needed is determined by the requirements of the statistical probability density function chosen to generate the code words 48'. This method will enhance computational time at the expense of increasing overall distortion. It should be recognized that the hashing function 254' and code words 48' generated by this method are usually different from those generated by the previous method.

The third approach is to use a multiplicity of sample vectors 248 to directly generate both the code book and the hashing function. This is depicted diagrammatically in FIG. 11. Code words constituting each of the subsets 48$i''$ of the code book are created directly from the sample vectors 248, preferably from a probability density function. The number of sample vectors 248 needed to ensure accurate results depends upon the exact statistical distribution used. The hashing function 254'' is generated to hash the sample vectors 248 into the optimal number of codegroups 48$i'''$. Once a sufficient number of the sample vectors 248 have been hashed and assigned a codegroup index, the hashed vectors and their respective indices are matched to define the codegroups of code words 48$i''$ in the code book. In this way, each of the code words is simultaneously defined and assigned an index. Instances where a codegroup 48$i''$ may not have an assigned code word should be handled as previously discussed. The hashing function 254'' and codegroups 48$i''$ are passed to a hashing means and storage means (neither depicted) for subsequent use.

Figure 11:
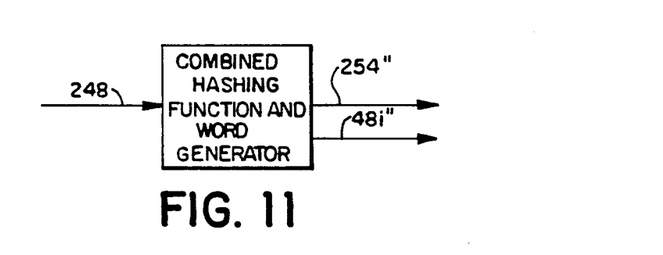
FIG. 11 depicts diagrammatically a third approach for generating the code words of the code book and the hashing function of the present invention.

This third approach has the advantage of balancing the aspects of the previous two cases. This third approach has the distinct disadvantage of requiring a sufficient level of experience to ensure good initial choices have been made. This third approach will also take the longest amount of time to converge to an acceptable system if the initial indices chosen are not close to the final indices. Experience for using this third approach can be gained by choosing the first two approaches repeatedly and observing the results.

Regardless of the approach taken, choosing the size of the code book needed is basically a decision of whether to optimize the vector quantization process for computational speed or minimizing signal distortion. In general, the larger the number of code words in the code book, the less distortion in the signal reproduction and the slower the computational time. Also, the size of the code book will affect the actual amount of compression that is achieved. The relationship between the number of code words in the code book and the compression ratio is exponential. For example, the signal vectors 28 previously described each contained sixteen signal elements (pixels) and each of these elements (pixels) contains 8 binary bits of information. If the code book contains 256 code words, the codes of each of the code words can be represented with 8 bits. The overall compression ratio achieved by replacing each code word 48 having sixteen, eight-bit elements, with a single, eight-bit address is sixteen-to-one. If twice as many address bits are used (sixteen bits) 65,536 code words can be provided. However, compression is only half as much, namely eight-to-one. The initial choice of code book size preferably should give a moderate amount of compression for the signal involved. For an audio or visual signal, a compression ratio of between about sixteen- and thirty-two-to-one is suggested. When the system is constructed, if the distortion is too high or the computational time too slow, the size of the code book can be adjusted. This should be repeated iteratively until satisfactory results are achieved.

Regardless of the approach taken, choosing the number of subsets into which the code words of the code book are divided is also a decision of whether to optimize computational speed or signal distortion. In general, as the number of subsets increases for a given number of code words, so does the speed of computation. Likewise, as the number of subsets increases, so does the amount of signal distortion. The savings in time is determined according to what fraction of the code book size you choose. If each subset of code words represents approximately one quarter of the code book, computational speed is increased by a factor of four when the present method is compared with sequential searching. However, the number of subsets has no effect on the compression ratio. The decision on the number of subsets preferably should be based on trying to obtain the lowest possible distortion in an acceptable computational time.

The following specific steps are recommended to assist in selecting the number of subsets into which the code book will be divided. Examine the type of signal to be compressed. Examine the characteristics of the vectors and what these characteristics represent. Order the importance of these characteristics to the signals to be compressed (consistencies, levels, dominant patterns, etc.). Determine the possible variation of the characteristics and their importance. List the characteristics considered essential for the application. Choose an initial, moderate value for the number of subsets. Preferably, this number should be around ¼ to ⅓ of the code book size. The number of essential characteristics should match the number of subsets. If the number of essential characteristics is less than the chosen number of subsets, add more features in order of importance to increase the number of essential characteristics. If the number of essential characteristics is more than the selected number of subsets, reevaluate the essential features and lower the number or change the number of subsets. Thus, each subset should be associated with an important feature of the signal to be compressed. After choosing the other system parameters, check speed and distortion levels. If the system is too slow, increase the number of subsets. If the system is too distorted, reduce the number of subsets. Continue checking speed and distortion levels until an acceptable speed with acceptable distortion level is found.

While preferred vector quantization process and apparatus embodiments have been described and numerous variations thereto disclosed or suggested, it will be recognized by those skilled in the art that additional changes could be made to the above-described embodiments of the invention without departing from the broad inventive concepts thereof. It is understood, therefore, that the invention is not limited to the particular embodiments disclosed, but is intended to cover any modification which are within the scope and spirit of the invention, as defined by the appended claims.

I claim:

1. A vector quantizer for data compression of a signal represented by a plurality of binary signal vectors, each signal vector being of a predetermined length and including a plurality of individual sample elements of the signal to be compressed, comprising:

hashing means for hashing each signal vector to generate a value identifying one of at least three different predetermined subsets of predetermined code words, each code word having a length equal to the predetermined length of the signal vectors and each code word having a unique associated binary code, each of the codes having a length less than the predetermined length of the signal vectors and code words; and output means for outputting from the vector quantizer a code associated with one code word of the one subset to represent the hashed signal vector, the one code word having the least distortion with respect to the hashed signal vector of all of the code words of the one subset.

2. The vector quantizer of claim 1 further comprising:
code book means for storing the at least three different subsets; and
comparison means for comparing the hashed signal vector with each code word of the one subset to determine a distortion between the hashed signal vector and each code word of the one subset and for comparing the distortions to identify the one code word of the one subset having the least distortion with respect to the hashed signal vector.

3. The vector quantizer of claim 1 wherein the hashing means selects sample elements from each signal vector, combines the selected sample elements and scales the combination of the selected sample elements to generate the value identifying the one subset of code words.

4. The vector quantizer of claim 3 wherein the sample elements of each signal vector are pixels of a video signal to be compressed, the pixels of each signal vector adjoining one another in a matrix portion of a two-dimensional array of the pixels, the array corresponding to an image frame of the video signal.

5. The vector quantizer of claim 4 further comprising means for averaging pixels adjoining one another in portions of an original, two-dimensional array of the pixels corresponding to the image frame of the video signal to generate a two-dimensional array of averaged pixels and wherein the hashing means operates on the averaged pixels.

6. The vector quantizer of claim 5 wherein the averaged pixels are generated from at least one of an I and a Q color difference components of a composite color video signal to be compressed.

7. The vector quantizer of claim 1 wherein the subsets are mutually exclusive.

8. The vector quantizer of claim 1 wherein each subset includes a plurality of code words.

9. A method for compressing data of a signal by vector quantization, the signal being represented by a plurality of binary signal vectors, each signal vector having a predetermined length and including a plurality of individual sample elements of the signal to be compressed, comprising the steps of:

hashing each signal vector to generate a value identifying one of at least three different predetermined subsets of predetermined code words, each code word having a length equal to the predetermined length of the signal vectors and each code word having a unique associated binary code, each of the codes having a length less than the predetermined length of the signal vectors and code words; and outputting a code associated with one of the code words of the one subset to represent the hashed signal vector, the one code word having the least distortion with respect to the hashed signal vector of all of the code words of the one subset.

10. The method of claim 9 further comprising the step of transmitting a plurality of the binary codes as a compressed representation of the signal, each code representing one of the plurality of binary signal vectors.

11. The compressed signal transmitted by the method of claim 10.

12. The method of claim 9 wherein the subsets are mutually exclusive.

13. The method of claim 12 wherein each subset includes a plurality of code words.

14. The method of claim 9 wherein the one subset includes a plurality of code words and further comprising the steps of:

storing the at least three different subsets of code words;

comparing the hashed signal vector with each code word of the one subset to determine a distortion between the hashed signal vector and each code word of the one subset; and comparing the distortions to identify the one code word of the one subset having the least distortion with respect to the hashed signal vector.

15. The method of claim 14 wherein said hashing step comprises the steps of:

selecting sample elements from the signal vector being hashed;

combining the selected sample elements; and scaling the combination of selected sample elements to generate the value identifying the one subset of code words.

16. The method of claim 15 wherein the sample elements of each hashed signal vector are pixels of a video signal to be compressed, the pixels of each signal vector adjoining one another in a matrix portion of a two-dimensional array of the pixels, the array corresponding to an image frame of the video signal.

17. The method of claim 16 further comprising the step of transmitting a plurality of the binary codes as a compressed representation of the signal, each code representing one of the plurality of binary signal vectors.

18. The compressed signal transmitted by the method of claim 17.

19. The method of claim 16 further comprising the preliminary step of averaging adjoining subsets of the pixels of the two-dimensional array to generate a two-dimensional array of averaged pixels and wherein the hashing step comprises selecting averaged pixels from the signal vectors.

20. The method of claim 16 wherein the averaged pixels are generated from a two-dimensional array of pixels from at least one of an I and a Q color difference components of a composite color video signal to be compressed.

21. A method of compressing data of a signal by vector quantization comprising the steps of:

generating a plurality of binary sample vectors from a sample signal similar to the signal to be compressed, each sample vector having a predetermined length and including a plurality of individual sample elements of the sample signal;

generating a set of binary code words from the plurality of sample vectors, each of the code words having a length equal to the predetermined length of the sample vectors to represent vectors of the predetermined length to be generated from the signal to be compressed;

generating a hashing function from the set of code words, the hashing function dividing the set of code words into at least three different subsets of code words; and storing the code words and the hashing function for future compression of the signal.

22. A method of compressing data of a signal by vector quantization comprising the steps of:

generating a plurality of binary sample vectors from a sample signal similar to the signal to be compressed, each sample vector having a predetermined length and including a plurality of individual sample elements of the sample signal;

generating a hashing function from the plurality of sample vectors, the hashing function dividing the plurality of sample vectors into at least three different subsets of code words;

generating at least one binary code word from each of the subsets, each of the code words having a length equal to the predetermined length of the sample vectors to represent binary vectors of the predetermined length to be generated from the signal to be compressed; and storing the code words and the hashing function for future compression of the signal.

23. A method of compressing data of a signal by vector quantization comprising the steps of:

generating a plurality of binary sample vectors from a sample signal similar to the signal to be compressed, each sample vector having a predetermined length and including a plurality of individual sample elements of the sample signal;

simultaneously hashing the sample vectors to divide the sample vectors into at least three different subsets and identifying from each of the subsets the most commonly occurring sample vectors as the code words of the subset;

storing the code words and the hashing function for future compression of the signal.

24. A vector quantizer for data compression of a signal represented by a plurality of binary signal vectors, each signal vector being of a predetermined length and including a plurality of individual sample elements of the signal to be compressed, comprising:

hashing means for hashing each signal vector to generate a value identifying one of at least three different predetermined subsets of predetermined code words, each code word having a length equal to the predetermined length of the signal vectors and each code word having a unique associated binary code, each of the codes having a length less than the predetermined length of the signal vectors and code words; and means for storing a plurality of the binary codes as a compressed representation of the signal, one binary code being stored for each hashed signal vector.

25. The vector quantizer of claim 24 further comprising:

code book means for storing the at least three different subsets; and comparison means for comparing the hashed signal vector with each code word of the one subset to determine a distortion between the hashed signal vector and each code word of the one subset and for comparing the distortions to identify the one code word of the one subset having the least distortion with respect to the hashed signal vector.

26. The vector quantizer of claim 24 wherein the hashing means selects sample elements from each signal vector, combines the selected sample elements and scales the combination of the selected sample elements to generate the value identifying the one subset of code words.

27. The vector quantizer of claim 26 wherein the sample elements of each signal vector are pixels of a video signal to be compressed, the pixels of each signal vector adjoining one another in a matrix portion of a two-dimensional array of the pixels, the array corresponding to an image frame of the video signal.

28. The vector quantizer of claim 27 further comprising means for averaging pixels adjoining one another in portions of an original, two-dimensional array of the pixels corresponding to the image frame of the video signal to generate a two-dimensional array of averaged pixels and wherein the hashing means operates on the averaged pixels.

29. The vector quantizer of claim 24 wherein the subsets are mutually exclusive.

30. The vector quantizer of claim 29 wherein each subset includes a plurality of code words.

31. A method for compressing data of a signal by vector quantization, the signal being represented by a plurality of binary signal vectors, each signal vector having a predetermined length and including a plurality of individual sample elements of the signal to be compressed, comprising the steps of:

hashing each signal vector to generate a value identifying one of at least three different predetermined subsets of predetermined code words, each code word having a length equal to the predetermined length of the signal vectors and each code word having a unique associated binary code, each of the codes having a length less than the predetermined length of the signal vectors and code words; and storing a plurality of the binary codes as a compressed representation of the signal, one binary code associated with one code word of the one subset of code words identified for each signal vector by the hashing step being stored for each hashed signal vector.

32. The method of claim 31 wherein the one subset includes a plurality of code words and further comprising the steps of:

comparing the hashed signal vector with each code word of the one subset to determine a distortion between the hashed signal vector and each code word of the one subset; and comparing the distortions to identify the one code word of the one subset having the least distortion with respect to the hashed input vector.

33. The method of claim 31 wherein said hashing step comprises the steps of:

selecting sample elements from the signal vector being hashed, combining the selected sample elements; and scaling the combination of selected sample elements to generate the value identifying the one subset of code words.

34. The method of claim 31 wherein the sample elements of each hashed signal vector are pixels of a video signal to be compressed, the pixels of each signal vector adjoining one another in a matrix portion of a two-dimensional array of the pixels, the array corresponding to an image frame of the video signal.

35. The method of claim 34 further comprising the preliminary step of averaging adjoining subsets of the pixels of the two-dimensional array to generate a two-dimensional array of averaged pixels and wherein the hashing step comprises selecting averaged pixels from the signal vectors.

36. The method of claim 31 wherein the subsets are mutually exclusive.

37. The method of claim 36 wherein each subset includes a plurality of code words.

38. The method of claim 31 wherein the storing step comprises storing the plurality of binary codes in a single data storage element.

39. The data storage element of claim 38 storing the plurality of binary codes.

40. The method of claim 30 wherein the storing step comprises storing the plurality of binary codes in a single data storage element.

41. The data storage element of claim 40 storing the plurality of binary codes.

* * * * *